(12) United States Patent
Keramat et al.

(10) Patent No.: US 8,364,433 B1
(45) Date of Patent: Jan. 29, 2013

(54) ACCURATE RESISTANCE CAPACITANCE (RC) TIME CONSTANT CALIBRATION WITH METAL-OXIDE-METAL (MOM) CAPACITORS FOR PRECISION FREQUENCY RESPONSE OF INTEGRATED FILTERS

(75) Inventors: Mansour Keramat, San Jose, CA (US); Syed S. Islam, Cupertino, CA (US); Mehrdad Heshami, Sunnyvale, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 635 days.

(21) Appl. No.: 12/338,792

(22) Filed: Dec. 18, 2008

(51) Int. Cl.
*G01R 27/00* (2006.01)
*G01R 35/00* (2006.01)
(52) U.S. Cl. ............. 702/107; 702/65; 702/85; 702/190
(58) Field of Classification Search .................. 702/107, 702/65, 85, 79, 190
See application file for complete search history.

(56) References Cited

U.S. PATENT DOCUMENTS

| 5,543,754 | A | * | 8/1996 | Onodera | 331/25 |
| 6,262,603 | B1 | * | 7/2001 | Mohan et al. | 327/77 |
| 2005/0168294 | A1 | * | 8/2005 | Kappes et al. | 331/36 C |
| 2008/0258806 | A1 | * | 10/2008 | Youssoufian et al. | 327/553 |
| 2009/0096488 | A1 | * | 4/2009 | Han et al. | 327/77 |

* cited by examiner

*Primary Examiner* — Phuong Huynh
(74) *Attorney, Agent, or Firm* — Heimlich Law, PC; Alan Heimlich, Esq.

(57) ABSTRACT

A calibration system employed for use with a resistance capacitance (RC) filter having resistors and capacitors with parasitic capacitance associated therewith. The calibration system has a digital calibration circuit receiving a time constant signal and generating, based thereon, a control word of N digital bits. The calibration system includes an analog monitor circuit having monitor capacitance assembly having a particular equivalent resistor and capacitor configuration. The analog monitor circuit generates the time constant signal and includes N switches, where each switch is controlled by one of the N bits of the control word, each switch is configured to connect or disconnect one or more capacitors of the monitor capacitor assembly thereby generating a time constant signal that represents the time constant of the RC integrated filter.

10 Claims, 9 Drawing Sheets

ACCURATE RESISTANCE CAPACITANCE (RC) TIME CONSTANT CALIBRATION WITH METAL-OXIDE-METAL (MOM) CAPACITORS FOR PRECISION FREQUENCY RESPONSE OF INTEGRATED FILTERS

FIELD OF THE INVENTION

This invention relates generally to calibration of resistance-capacitance (RC) time-constant in analog integrated circuits, and more specifically to calibration of RC integrated filters.

BACKGROUND OF THE INVENTION

Modern semiconductor integrated circuits (ICs, commonly referred to as chips) are manufactured by means of a very complex process that may involve several hundred separate processing steps. Use of stringent quality control procedures and advanced manufacturing equipment is routine. Nevertheless, it is inevitable that the electrical characteristics of individual chips vary significantly from each other due to process variations. Further, the electrical characteristics of any particular integrated circuit vary as its operating conditions vary, for example, its temperature and power supply.

For some ICs, such variations can be plus or minus 15% for the resistance of a resistor and up to 20% for the capacitance of a metal oxide metal (MoM) capacitor. These variations directly affect the timing of the signals of the IC. Signal timing in digital ICs is generally synchronized by clock signals, which allows correct operation despite a certain amount of variation. In contrast, analog ICs are generally very sensitive to timing variations.

For example, in the case of an IC that implements a resistance capacitance (RC) low pass filter, the process variations of resistor and capacitor directly affect the cut off frequency. The cut off frequency is inversely proportional to the resistance capacitance product (called time constant) which can vary ±35%. A low pass filter allows the signal components with frequencies below cutoff frequency to pass and the filter stops or at least attenuates signal components higher than the cut off frequency. Many electronic devices that use low pass filters cannot tolerate a substantial variation in cut off frequency. Some electronic devices will not operate properly if a low pass filter does not meet stringent frequency requirements. Bandwidths of other types of resistor-capacitor based filters, such as high pass, band pass and band reject are associated with time constants and in certain applications must meet stringent frequency requirements.

Typically, an RC time-constant calibration circuit is single-ended while RC filters are fully-differential. As a result, the effects of parasitics in the filter are different from those in the calibration circuit. This causes a significant degradation in calibration accuracy. Thus, an accurate RC time-constant calibration circuit is needed.

Thus, there is a need for a system and method to accurately calibrate RC time-constants of integrated filters.

SUMMARY OF THE INVENTION

To overcome the limitations described above, and to overcome other limitations that will become apparent upon reading and understanding this specification, this invention includes a calibration system adapted for use with a resistance capacitance (RC) integrated filter. Integrated, as used herein, refers to the manufacturing of a device onto an IC. For example, an RC integrated filter is an RC filter that is built on an IC.

The calibration system is adapted for use with a resistance capacitance (RC) filter having resistors and capacitors with parasitic capacitance associated therewith. The calibration system has a digital calibration circuit receiving a time constant signal and generating, based thereon, a control word of N digital bits. The RC integrated filter comprises resistors and capacitors of a particular configuration, the time constant of the RC integrated filter varies in response to the control word. The calibration system includes an analog monitor circuit having monitor capacitance assembly having a particular equivalent resistor and capacitor configuration. The analog monitor circuit generates the time constant signal and includes N switches, where each switch is controlled by one of the N bits of the control word, each switch is configured to connect or disconnect one or more capacitors of the monitor capacitor assembly thereby generating a time constant signal that represents the time constant of the RC integrated filter.

These and other aspects of this invention will become apparent to those skilled in the art after having read the figures and the following detailed description.

DETAILED DESCRIPTION

In the following description of the embodiments, reference is made to the accompanying drawings that form a part hereof, and in which is shown by way of illustration of the specific embodiments in which the invention may be practiced. It is to be understood that other embodiments may be utilized because structural, functional, usage, and other changes may be made without departing from the scope of the present invention.

The parameters and symbolically named signals used herein are described in the following table:

TABLE 1

Description of Parameters and Signals

| Parameter/Signal | Description |
| --- | --- |
| $C_a$ | The adjustable capacitance within capacitance assemblies 116 and 146 that is connected or disconnected according to control word 125 |
| $C_b$ | The capacitance within capacitance assemblies 116 and 146 that is always connected |
| $C_{cal}$ | The total capacitance of monitor capacitance assembly 146, including parasitic capacitances, as given by Eq. 7 |
| $C_{lpf}$ | The total capacitance of filter capacitance assembly 116, including parasitic capacitances, as given by Eq. 8 |
| $C_u$ | Unit capacitor, i.e., an integer multiple of this is the nominal total capacitance of either capacitance assembly 116 or 146 ignoring parasitic capacitances |
| $C_X$ | The parasitic capacitance within capacitance assemblies 116 and 146 present on node X |
| $C_Y$ | The parasitic capacitance within capacitance assemblies 116 and 146 present on node Y |
| $C_\Delta, 2C_\Delta, \ldots 2^{N-1}C_\Delta$ | The binary weighted values of the capacitors within capacitance assemblies 116 and 146 that are connected and disconnected |
| $f_o$ | Frequency of time constant signal 149 |
| $f_{REF}$ | Frequency of reference clock 325 |
| LPF_BW[M−1:0] | Low pass filter (LPF) band select control bits |
| LPF_CAP [N−1:0] | The N bits of control word 125, also known as $x_c$ [N−1:0] |
| NT | Number of reference clock cycles within four periods of time constant signal 149 |
| NT_NOM | Nominal value of NT |
| PD | Power down control signal |
| refp | Positive reference voltage (also known as higher reference voltage) used in relaxation circuit 400 |
| refn | Negative reference voltage (also known as lower reference voltage) used in relaxation circuit 400 |
| $R_u$ | Unit resistor |
| $T_{nom}$ | Nominal period as corrected by process 900 to take into account parasitic capacitance mismatch |
| $V_c$ | Voltage on monitor capacitance assembly 146 |
| $V_o$ | Output of analog monitoring circuit 140, i.e., time constant signal 149 |
| $V_{REF}$ | Reference voltage currently being used in relaxation oscillator 400 |
| $x_n$ | The normalized value of control word 125, as given by Eq. 6 |
| α, β, and γ | The fraction that represent the parasitic to desired capacitance ratio at a given node used in a typical model of an metal oxide metal (MoM) capacitor |

Figure 1:
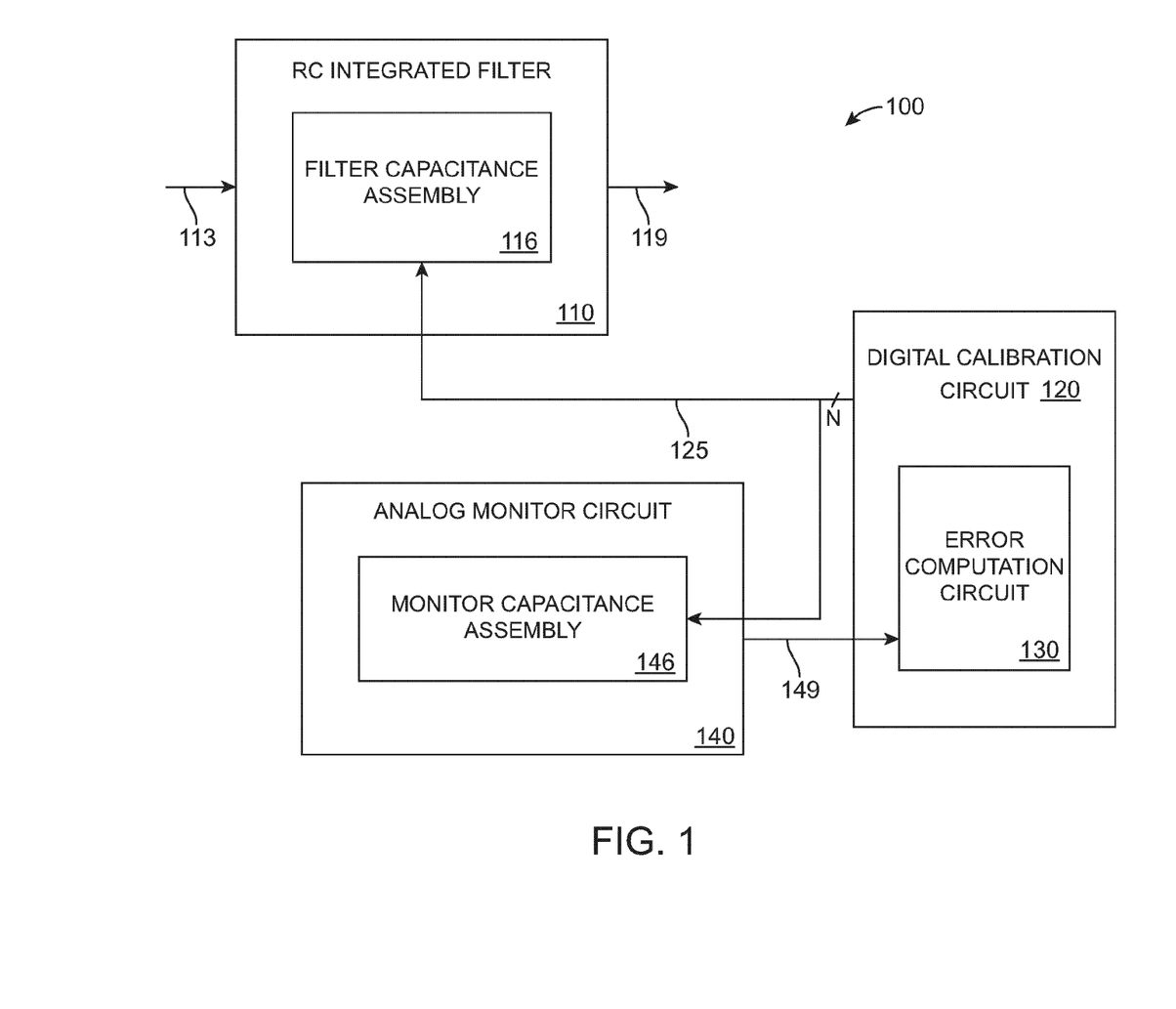
FIG. 1 shows a block diagram of calibration system 100 according to an embodiment of the present invention.

FIG. 1 shows a block diagram of calibration system 100 according to an embodiment of the present invention. System 100 includes RC filter 110, analog monitor circuit 140, and digital calibration circuit 120.

RC filter 110 and analog monitor circuit 140 are each shown to receive control word 125 from the digital calibration circuit 120.

RC filter 110 is an analog filter and receives input signal 113 and generates there from filtered signal 119. RC filters are well known to those skilled in the art. Briefly, filters serve to remove signals having certain frequencies and to pass on the remaining signals. Filters are commonly used by a variety of application, such as in, but not limited to, communication systems having modulators/demodulators.

Figure 2:
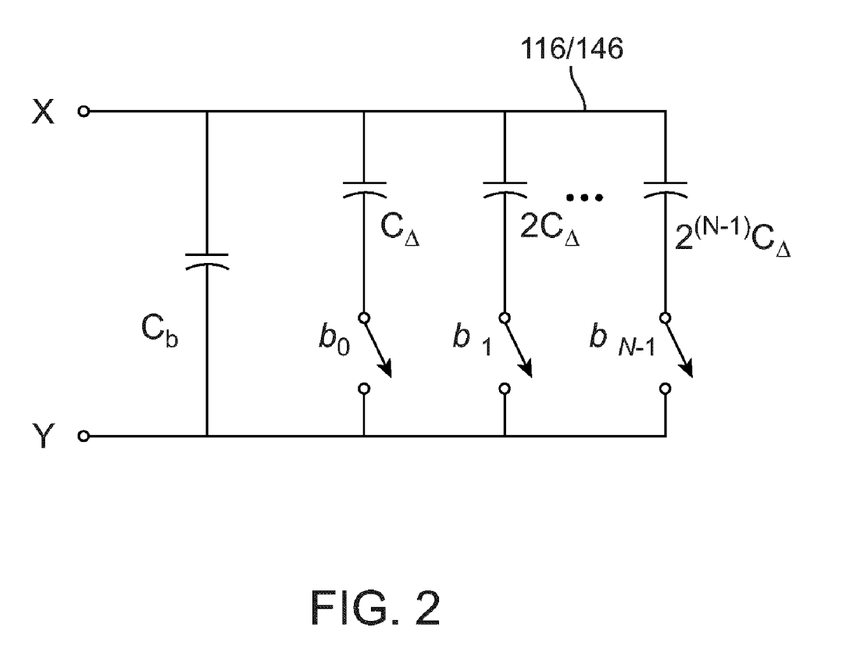
FIG. 2 shows a circuit diagram of capacitance assemblies 116 and 146 according to an embodiment of the present invention.

Filter 110 includes filter capacitance assembly 116, which is further described in reference to FIG. 2. The capacitance provided by assembly 116 varies in response to the value of control word 125. Assembly 116 forms the capacitance used for the RC circuit within the filter 110.

In some embodiments of the present invention, RC filter 110 is a low pass filter. A low pass filter allows signals of certain frequencies below a predetermined frequency and blocks signals of frequencies higher than the predetermined frequency.

Analog monitor circuit 140 includes calibration capacitance assembly 146 which is also further described in reference to FIG. 2. In some embodiments, filter capacitance assembly 116 and calibration capacitance assembly 146 are exact replicas of each other, also known as images.

Monitor circuit 140 generates time constant signal 149. The period of time constant signal 149 varies in the same manner as the time constant of that of the RC filter 110, with each varying in response to control word 125. In some embodiments, monitor circuit 140 is a relaxation oscillator. Monitor circuit 140 is further described in reference to FIG. 4.

Figure 3:
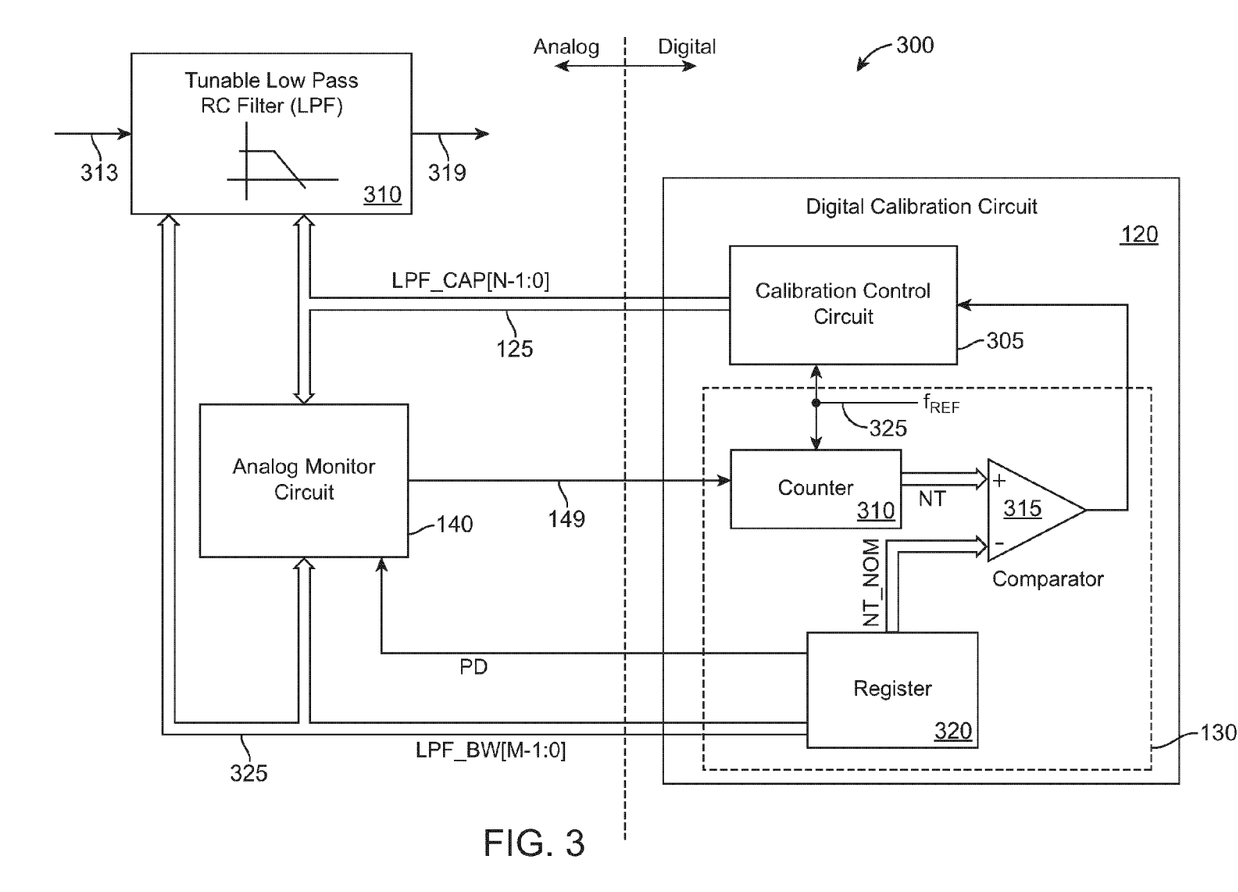
FIG. 3 shows a block diagram of calibrated low pass filter 300 according to another embodiment of the present invention.

Digital calibration circuit 120 includes error computation circuit 130, which is further described in reference to FIG. 3. In some embodiments, digital calibration circuit 120 also includes a processor that receives an error value from circuit 210 and based thereon generates control word 125 and that controls the calibration process. The calibration process is further described in reference to FIGS. 8 and 9.

Control word 126 is N digital bits, i.e., LPF_CAP [N−1:0]. Larger values of N provide for more accurate calibration of RC filter 110.

In operation, the analog monitor circuit 140 generates the signal 149 and provides the same to the digital calibration circuit 120, which serves to calibrate the signal 149 and based on such calibration, generates the control word 125 for use by the filter 110 and the analog monitor circuit 140. The filter 110 uses the control word to adjust the time constant of its filter capacitance assembly 116 such that the RC time constant of the filter 110 resembles that of the analog monitor circuit 140

The calibration system 100 may be employed with virtually any RC filter and certainly with filters other than low pass filters. The bandwidth of the RC filter is determined by an RC time constant in RC-based high pass, band pass and band reject filters. The calibration method and apparatus of the various embodiments of the present invention advantageously define the bandwidths of the filters precisely. For example, the embodiment of FIG. 1 calibrates the RC time constant of the filter 110 using the control word 125 in a manner that is advantageously more precise than that of prior art techniques.

Analog monitor circuit 140 includes calibration capacitance assembly 146 which is also further described in reference to FIG. 2. In some embodiments, filter capacitance assembly 116 and calibration capacitance assembly 146 are analogous or exact replicas of each other.

Monitor circuit 140 generates time constant signal 149. The period of time constant signal 149 varies in the same manner as the time constant of that of the RC filter 110, with each varying in response to control word 125. In some embodiments, monitor circuit 140 is a relaxation oscillator. Monitor circuit 140 is further described in reference to FIG. 4.

Digital calibration circuit 120 includes error computation circuit 130, which is further described in reference to FIG. 3. In some embodiments, digital calibration circuit 120 also includes a processor that receives an error value from circuit 210 and based thereon generates control word 125 and that controls the calibration process. The calibration process is further described in reference to FIGS. 8 and 9.

Control word 126 is N digital bits, i.e., LPF_CAP [N−1:0]. Larger values of N provide for more accurate calibration of RC filter 110.

FIG. 2 shows a circuit diagram of the filter capacitance assembly 116 or the calibration capacitance assembly 146 according to an embodiment of the present invention. Each one of assemblies 116 and 146 includes N+1 capacitors and N switches. The capacitors are coupled together in parallel when each of the switches being in a closed position. Accordingly, the N+1 capacitors are shown coupled together in parallel. That is, one end of all capacitors is coupled to node X and the other end of all capacitors (if the switch is closed) is connected to node Y.

Figure 4:
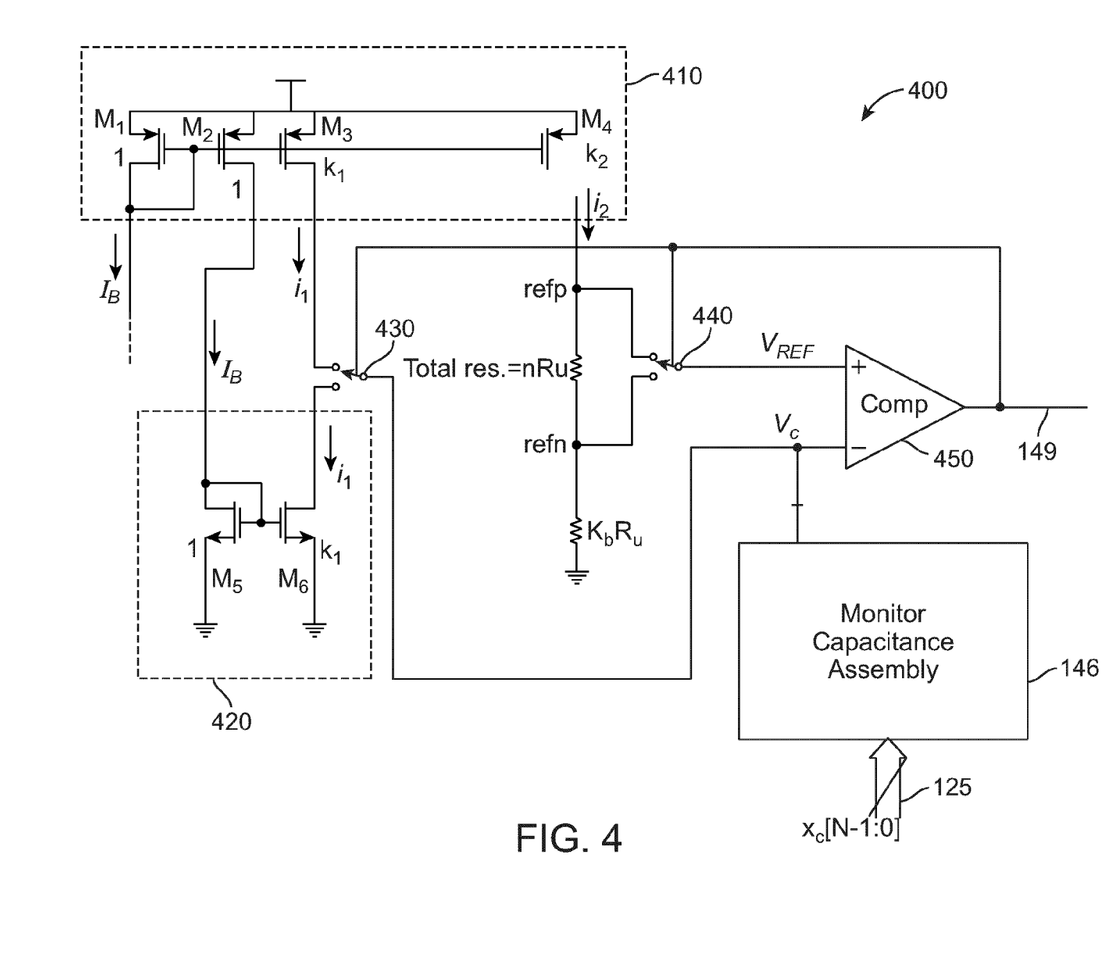
FIG. 4 shows a circuit diagram of relaxation oscillator 400 according to an embodiment of the present invention.

In the embodiment of FIG. 2, node Y is coupled to ground (or substantially zero volts) while node X is coupled to the Vc node of the embodiment of FIG. 4. In one embodiment of the present invention, the circuit diagram of FIG. 2 is used with a differential type of circuit (i.e., RC filters) where neither node X nor node Y is connected to ground or power supply voltage Vcc. One of the capacitors with a capacitance of $C_b$ is permanently coupled between X and Y whereas the remaining capacitors are switched on and off (or connected to other capacitors in parallel or disconnected to other capacitors) through a corresponding switch. For example, switch $b_0$ turns on or off its respective capacitor, which is shown having a capacitance of $C_A$. It is well known that capacitors' capacitances add when the capacitors are coupled in parallel. Thus, when switches $b_0$ and $b_1$ are in the 'on' position to couple two capacitors of capacitances $C_A$ and $2 C_A$, the capacitance resulting therefrom is $3 C_A$.

Assemblies 116 and 146 are each configured to provide a unit capacitance that varies, depending on the value of control word 125, between the capacitance of one of the capacitors, i.e. $C_b$ which is always connected, and the capacitance of all N+1 of the capacitors. Varying the unit capacitance varies the time constant of the filter or the monitor circuit that includes the capacitance assembly.

In the embodiment shown in FIG. 2, the capacitance of $C_b$ is independent of the value of $C_A$. For the N capacitors that are connected and disconnected, the capacitance of the first switched capacitor is $C_A$, the second is $2C_A$, the third is $4C_A$, and so on. As shown in FIG. 2, the first switched capacitor (the smallest) is connected or disconnected according to bit 0, which is the least-significant bit (LSB) of LPF_CAP[N−1:0], and the last switched capacitor (the largest) is connected or disconnected according to bit N−1, which is the most-significant bit (MSB) of LPF_CAP[N−1:0].

In FIG. 2, the first switched capacitor is shown to have a capacitance of $C_A$ and the second switched capacitor is shown to have a capacitance of $2 C_A$ and the last switched capacitor is shown to have a capacitance of $2^{(N-1)} C_A$. The first switched capacitor is shown to be connectable to the node Y through the switch $b_0$, the second switched capacitor is shown to be connectable to the node Y through the switch $b_1$ and the last switched capacitor is shown to be connectable to the node Y through the switch $b_{N-1}$.

It is understood by those skilled in the art that various arrangements, other than those shown and discussed relative to FIG. 2, of capacitance values may be used in various embodiments. Further, various embodiments may connect and disconnect circuit elements other than capacitors, including but not limited to, resistors and inductors. The selection of capacitance $C_b$, which in one embodiment is considered a base capacitance or the capacitor associated with such capacitance is considered a base capacitor, and the adjustable components of FIG. 2 depends on the range of time constant variation due to process. The number of control bits as well as selection of $C_A$ depends on the accuracy requirements of the time constant calibration. Moreover, any combination of capacitors other than those indicated in FIG. 2 may be employed. In fact, the configuration, number of capacitors and the like are designed to reflect that of the filter 110.

FIG. 3 is a block diagram of calibrated low pass filter 300 according to another embodiment of the present invention. Calibrated low pass filter 300 includes analog monitor circuit 140 which is described in reference to FIG. 1, tunable low pass RC filter 310, and digital calibration circuit 120.

Tunable low pass RC filter 310 receives input signal 313 and generates therefrom filtered signal 319. Tunable low pass RC filter includes capacitance assembly 116. Assembly 116 adjusts its unit capacitance in response to bits LPF_CAP[N−1:0], i.e., in response to control word 125. This capacitance adjustment calibrates the time constant and the cutoff frequency of filter 310. The time constant and the cutoff frequency of filter 310 are further controlled by band selection bits LPF_BW[M−1:0], which select the frequency band within which filter 310 operates.

Digital calibration circuit 120 includes error computation circuit 130, and calibration control circuit 305 which in some embodiments is a processor.

Error computation circuit 130 includes register 320, counter 310, and comparator 315. The time constant and cutoff frequency of tunable low pass RC filter 310 is tuned by varying the value held in register 320. This value includes both band selection bits LPF_BW[M−1:0] and NT_NOM. The band selection bits select the band within which filter 310 operates, for example, a 1 MHz band versus a 3 MHz band. NT_NOM is the nominal value (also known as the target value) of how many cycles of the reference clock should be in $M_c$ cycles ($M_c$ which in the embodiment of FIG. 3 is equal to 4) of time constant signal 149, thus setting the exact nominal time constant and cutoff frequency of filter 310. Register 320 provides bits LPF_BW[M−1:0] both to tunable low pass RC filter 310 and to analog monitor circuit 140. Register 320 provides NT_NOM to comparator 315.

Counter 310 counts the number of cycles of reference clock 325 that occur in four cycles of time constant signal 149. The final value of this count is NT, which counter 310 provides to comparator 315. Comparator 315 determines whether NT_NOM or NT is larger, thus generating digital signal of logic 1 if NT>NT_NOM or of logic 0 if NT<NT_NOM, which is provided to calibration control circuit 305. The calibration control circuit 305 then determines the LPF_CAP[N−1:0] bits based on the processes described in FIGS. 8 and 9.

FIG. 4 shows a circuit diagram of relaxation oscillator 400 according to an embodiment of the present invention. In some embodiments, analog monitor circuit 140 is or includes relaxation oscillator 400. Oscillator 400 alternates between a charge phase and a discharge phase. Oscillator 400 includes monitor capacitance assembly 146, which provides the capacitance for the RC network that forms the relaxation oscillator.

Relaxation oscillator 400 includes current source 410 which is used to charge assembly 146 through M3, and current sink 420 which is used to discharge assembly 146 through M6. Oscillator 400 also includes switch 430, which connects assembly 146 to either the current source 410 (while charging) or the current sink 420 (while discharging).

The current source 410 is a current source generally known to those skilled in the art, as is the current sink 420. Each of the current source 410 and current sink 420 is shown to comprise a number of transistors coupled together in parallel, consistent with known current source designs, where each transistor includes a control gate, a source and a drain. Transistors M1-M4 are matched to each other. Similarly, M5 and M6 are matched to each other. The drain of M1 is connected to an external current sink $I_B$. $I_B$ is represented by the following equation, $$I_B = \frac{V_{BG}}{R_B} \qquad \text{Eq. (1)}$$

where $V_{BG}$ is bandgap reference voltage and $R_B$ is the on chip bias resistor. $R_B$ is process and temperature dependent. $I_B$ can be generated from on chip bandgap reference generator. The variation of $I_B$ due to the variations of $V_{BG}$ and $R_B$ has to be considered in the design of the analog monitor circuit of various embodiments of the present invention. Note that, when $I_B$ is passed through an on chip resistor (say $R_x$) the voltage across it ($=R_x \cdot V_{BG}/R_B$) becomes mainly dependent on $V_{BG}$ as the process dependence of on chip resistors approximately cancels out. $I_B$ is mirrored through M1 and M4 to generate reference voltages for the relaxation oscillator refp and refn. M4 has $k_2$ times aspect ratio (width/length) compared to M1 ($i_2=k_2 \cdot I_B$). Thus the reference voltages represented by the following equation:

$$refp = k_2 I_B (n R_u + K_b R_u) \text{ and } refn = k_2 I_B K_b R_u \qquad \text{Eq. (2)}$$

Where $R_u$ is the unit resistor which is used in both analog monitor and RC filter circuits. $K_b$ and n are factors.

M3 has $k_1$ times aspect ratio compared to M1. Similarly, M6 has $k_1$ times aspect ratio compared to M5. This makes charging or discharging currents $i_1 = k_1 \cdot I_B$.

Relaxation oscillator 400 also includes switch 440. Switch 440 connects $V_{REF}$ to one of refp or refn. Voltage refp is the positive reference voltage (also known as the higher reference voltage) used during the charge phase, and refn is the negative reference voltage (also known as the lower reference voltage) used during the discharge phase.

Relaxation oscillator 400 also includes comparator 450. Comparator 450 compares $V_{REF}$, i.e., the value of the reference voltage that is currently being used, with $V_c$, i.e., the voltage on monitor capacitance assembly 146. Based on this comparison, comparator 450 produces time constant signal 149, which is a digital signal. Signal 149 determines whether oscillator 400 is in charge phase or discharge phase. If $V_c$ is lower than $V_{REF}$ then oscillator 400 is in charge phase, and if $V_c$ is higher than $V_{REF}$ then oscillator 400 is in discharge phase. Signal 149 controls switches 430 and 440, and is also provided to digital calibration circuit 120.

Time constant signal 149 switches $V_{REF}$ between refp and refn such that $$\Delta V_{REF} = refp - refn = k_2 I_B n R_u \qquad \text{Eq. (3)}$$

Figure 5:
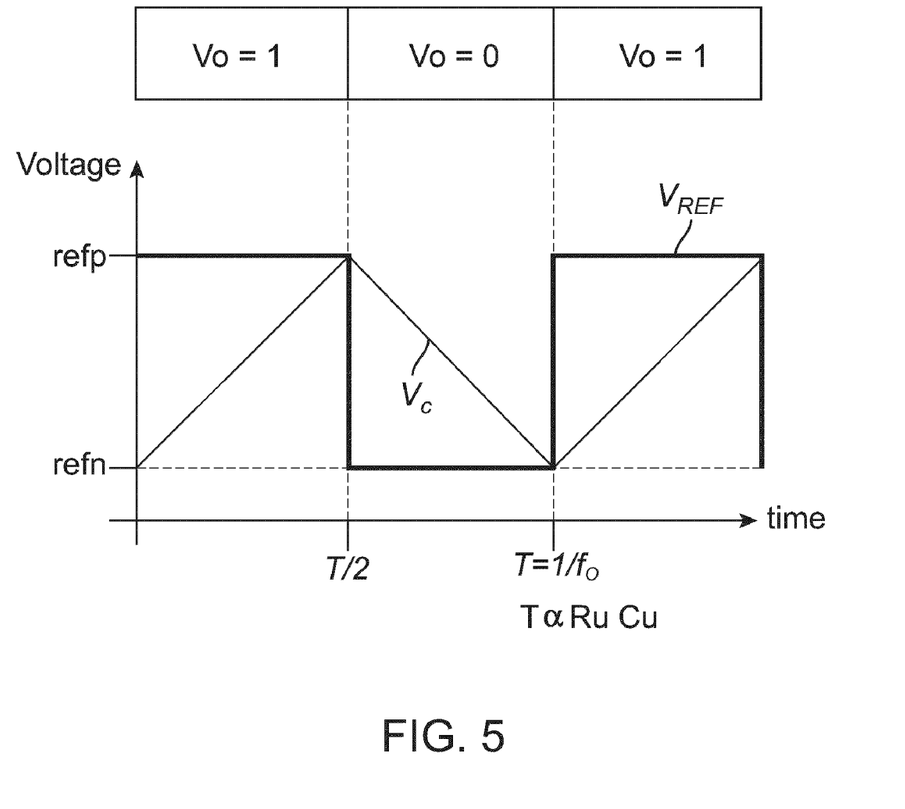
FIG. 5 shows a timing diagram of time constant signal 149, $V_c$, and $V_{REF}$ according to the embodiment of the present invention shown in FIG. 4.

Monitor capacitance assembly charges or discharges with current $k_1 \cdot I_B$ depending upon the logic state of time constant signal 149. As described in the timing diagram of FIG. 5, the period of the time constant signal is represented by:

$$T = mn \frac{2k_2}{k_1} R_u C_u \qquad \text{Eq. (4)}$$

As Eq. 4 shows, the period of time constant signal 149 is proportional to the time constant ($R_u C_u$).

Relaxation oscillator 400 provides time constant signal 149 to digital calibration circuit 120 as shown in FIG. 1. The period of time constant signal 149 is calculated and compared with the nominal period, as currently set. Control word 125 is generated based on this comparison, and is used to adjust $C_u$, to calibrate the time constant of the RC fitter.

FIG. 5 shows a timing diagram of time constant signal 149, $V_c$, and $V_{REF}$ according to the embodiment of the present invention shown in FIG. 4. The diagram starts at t=0, which is the start of a charging phase of relaxation oscillator 400. At t=0 signal 149 has the value "one", and it stays "one" until t=T/2, i.e., half way through one cycle of signal 149. At t=0 $V_{REF}$ is at refp, and it stays at refp until t=T/2. At t=0 $V_u$ is at refn, and it increases as charged by positive current source 410 through switch 430. $V_c$ continues to increase until $V_c$ crosses refp. At that time (t=T/2), output of the comparator changes state from logic "one" to logic "zero". This switches $V_{REF}$ to refn and the monitor capacitance assembly 146 enters in a discharge phase.

The discharge phase starts at t=T/2. At t=T/2 signal 149 has the value "zero", and it stays "zero" until t=T, i.e., the end of one cycle of signal 149. At t=T/2 $V_{REF}$ is at refn, and it stays at refn until t=T. At t=T/2 $V_c$ is at refp, and continues to decrease as the capacitor bank 146 is discharged through negative current source 420 and switch 430. The decrease in $V_c$ continues until $V_c$ reaches refn, which occurs at t=T, at which time oscillator 400 changes output state and the capacitor bank 146 enters in a charge phase.

FIGS. 6a, 6b, 7a and 7b each shows a circuit diagram, and their interconnections, of models used in an embodiment of the present invention of the parasitic capacitances associated respectively with monitor capacitance assembly 146 and with the filter capacitance assembly 116.

Figure 6A:
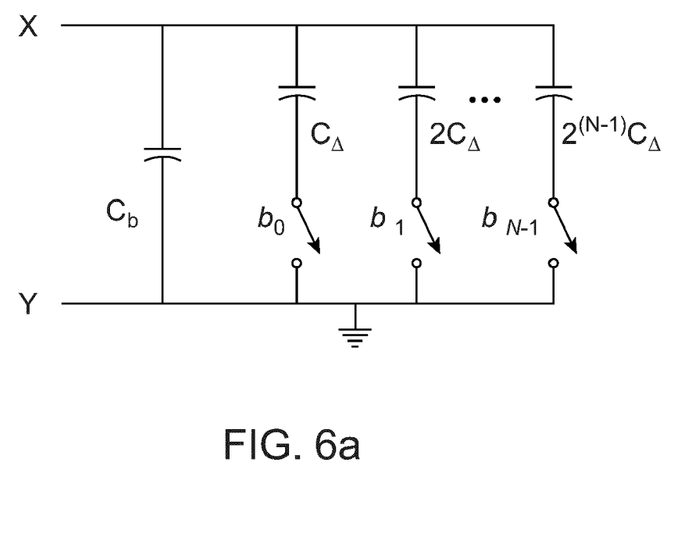
FIGS. 6a and 6b show circuit elements and their interconnections in a model of the parasitic capacitances associated with the analog monitor capacitance assembly used in an embodiment of the invention.
Figure 6B:
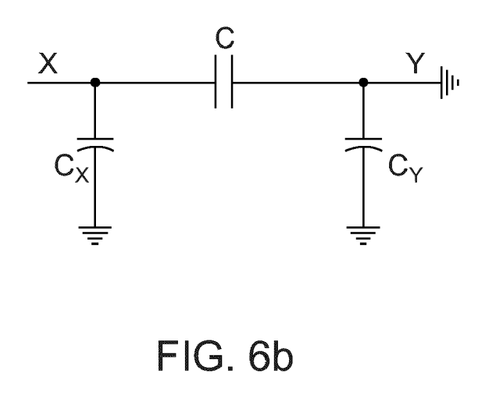

The capacitor assemblies in the RC filter and the monitor circuit unintentionally provide different capacitances due to their different parasitic components due to their different orientations. Thus, the accuracy of the calibration procedure can be significantly improved by modifying the calibration process to take this effect into account. It should be noted that the calibration circuit is single-ended while the LPF circuit is fully differential. In the calibration circuit, the one end of the capacitor is connected to the ground as shown in FIGS. 6a and 6b. But in the LPF circuit, the capacitor is connected between two floating nodes and the use of back to back capacitors, as shown in FIGS. 7a and 7b, can provide symmetrical parasitic capacitors at both ends.

As is known to those skilled in the art, a metal oxide metal (MoM) capacitor, is often modeled as incorporating a parasitic capacitance component located between ground and each of the metal layers that form the MoM capacitor. According to this model, the desired capacitance C between two nodes comes with a parasitic component $\alpha C$ at one of the nodes and parasitic component $\beta C$ at the other node. The typical MoM capacitor model assumes that $\alpha \approx \beta = \gamma$.

Figure 7A:
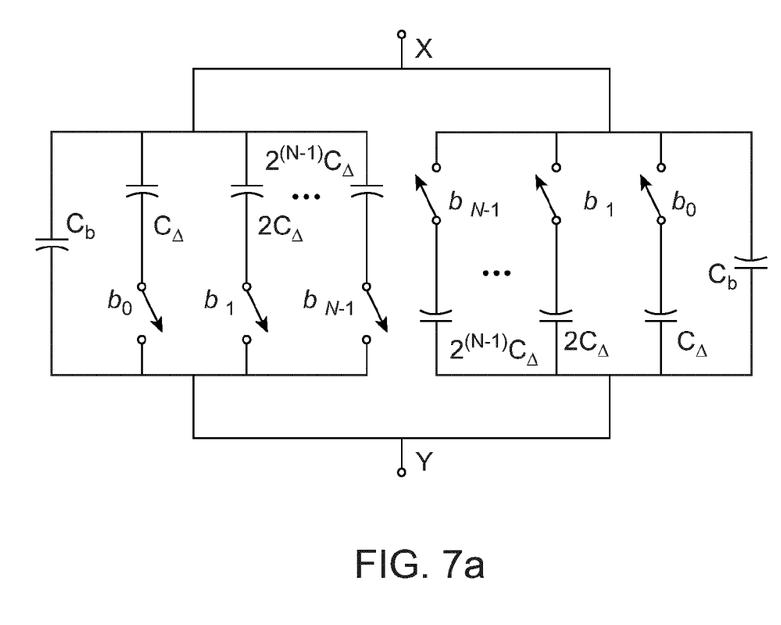
FIGS. 7a and 7b show circuit elements and their interconnections in a model of the parasitic capacitances associated with the filter capacitance assembly used in an embodiment of the invention.
Figure 7B:
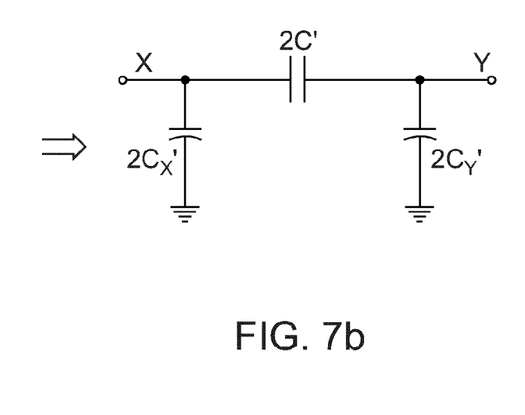

The corresponding models for the capacitance assemblies used in the analog monitoring circuit and RC filter are shown in FIGS. 6 and 7 respectively. They differ because monitor assembly 146 circuit is single-ended while filter assembly 116 is fully differential.

In some embodiments, using a minimum size transistor switch in capacitance assemblies 116 and 146 is sufficient to meet the targeted operating frequencies. In such embodiments, the effects of the switch parasitic capacitors are small and can be neglected.

The unit capacitance has two components, $C_a$ and $C_b$, where $C_b$ is always connected and $C_a$ is the currently connected capacitance from the switched capacitors. The maximum value of the adjustable component is given by, $$C_a = C_\Delta + 2C_\Delta + \ldots + 2^{N-1} C_\Delta \qquad \text{Eq. (5)}$$

In the following, the impact of parasitic components of calibration circuit and LPF unit capacitors on overall calibration accuracy is described. It is assumed that, $C_a \approx C_b$ and the normalized control code $x_n$ is given by:

$$x_n = \frac{b_{n-1}2^{N-1} + \ldots + b_1 2^1 + b_0}{2^N} \qquad \text{Eq. (6)}$$

The overall (including parasitic) capacitance in monitoring capacitance assembly 146 between node X and ground is defined as $C_{cal}$ and is given by:

$$C_{cal} = C + C_X = C_b[1 + 3\gamma + (1-\gamma)x_n] \qquad \text{Eq. (7)}$$

Assuming that the same size capacitors are used in filter capacitance assembly 116 as are used in monitor capacitance assembly 146, the overall (including parasitic) capacitance between nodes X and Y in filter capacitance assembly 116 is defined as $C_{lpf}$ and is given by:

$$C_{lpf}C' + C'_X/2 = C_b[1 + \gamma + x_n] \qquad \text{Eq. (8)}$$

The accuracy of the calibration procedure can be estimated by assuming that $\gamma/(1+x_n) \ll 1$. In this case, $$\frac{C_{cal}}{C_{lpf}} \approx 1 + \frac{\gamma(2 - x_n)}{(1 + x_n)}. \qquad \text{Eq. (9)}$$

With $\gamma=4\%$ and $0 \leq x_n \leq 1$, the mismatch between $C_{cal}$ and $C_{lpf}$ can vary from 2% to 8%. While the purpose of calibration, in one embodiment of the present invention, is to bring the accuracy below 8% (say 5%). Thus, correcting for this difference in parasitic capacitances can substantially improve the accuracy of the calibration of RC filter 110.

Figure 8:
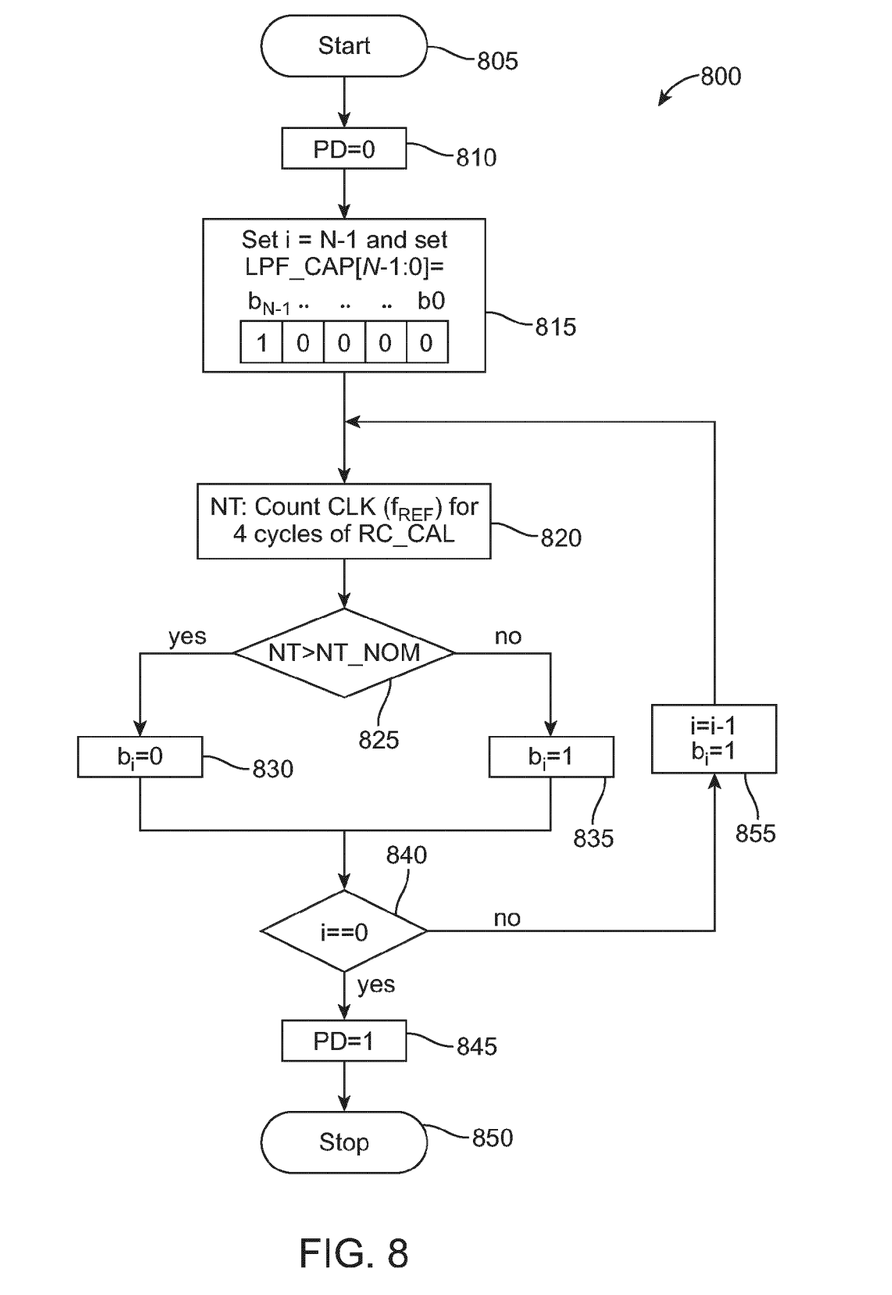
FIG. 8 shows a flow chart for process 800 of calibrating RC time-constant according to an embodiment of the present invention.

FIG. 8 shows a flow chart for process 800 of calibrating RC time-constant according to an embodiment of the present invention. Process 800 is employs a binary search algorithm, as is well known to those skilled in the art. The binary search algorithm determines one bit at a time by comparing an assumed value of the unknown quantity with a user-defined reference. The process starts with MSB and converges when LSB is determined. The binary search algorithm is fast and overall accuracy depends on number of calibration bits.

To minimize the mismatch between capacitance assemblies 116 and 146, the value of each bit of the N-bit control word 125 is determined by comparing the actual time period of time constant signal 149, i.e., NT, with its nominal value, i.e., NT_NOM. The bits are set in order, starting with bit N–1 (MSB) and going down to bit 0 (LSB). This corresponds with the arrangement of capacitors within capacitance assembly 116 and 146, in which bit N–1 controls connects or disconnects the largest switched capacitor, and bit 0 connects or disconnects the smallest switched capacitor.

Action 815 initializes calibration process 800. The variable i indexes the bits of control word 125 and is initialized to N–1. The value of control word 125 is set to a "one" in bit N–1 and "zero" in the other bits.

In action 820, NT is generated by counting reference clock cycles during four cycles of time constant signal 125. Then NT is compared with its nominal value NT_NOM. If NT>NT_NOM, bit i=N–1 is reset to 'zero' 830.

In the next step, at 825, the following bit is determined. The bit i=N–2 is set to '1' and NT is recalculated to compare with NT_NOM. Based on the comparison bit i=N–2 is determined. That is, if NT is greater than NT_NOM, the process proceeds to step 830 where $b_i$ is set equal to '0' or if NT is equal or smaller than NT_NOM, the step 835 is performed where the $b_i$ is set equal to '1'. After steps 830 and 835, the process proceeds to 840 and if i is not equal to zero (or there are more bits to be determined), the process continues until the bit i=0 at which time, at step 845, power down is asserted by setting PD=1 and process 800 ends.

Process 800 includes actions 810 and 845, which respectively power up and power down analog monitor circuit 140. In some embodiments, calibration process 800 only occurs on initial power up or when band selection bits LPF_BW[M–1:0] are altered. In such embodiments, analog monitor circuit 140 is not needed at other times; thus power consumption can be reduced by powering it down. In other embodiments, process 800 (or a partial version thereof) is repeated periodically in order to maintain the calibration of RC filter 110 as its operating conditions change.

Figure 9:
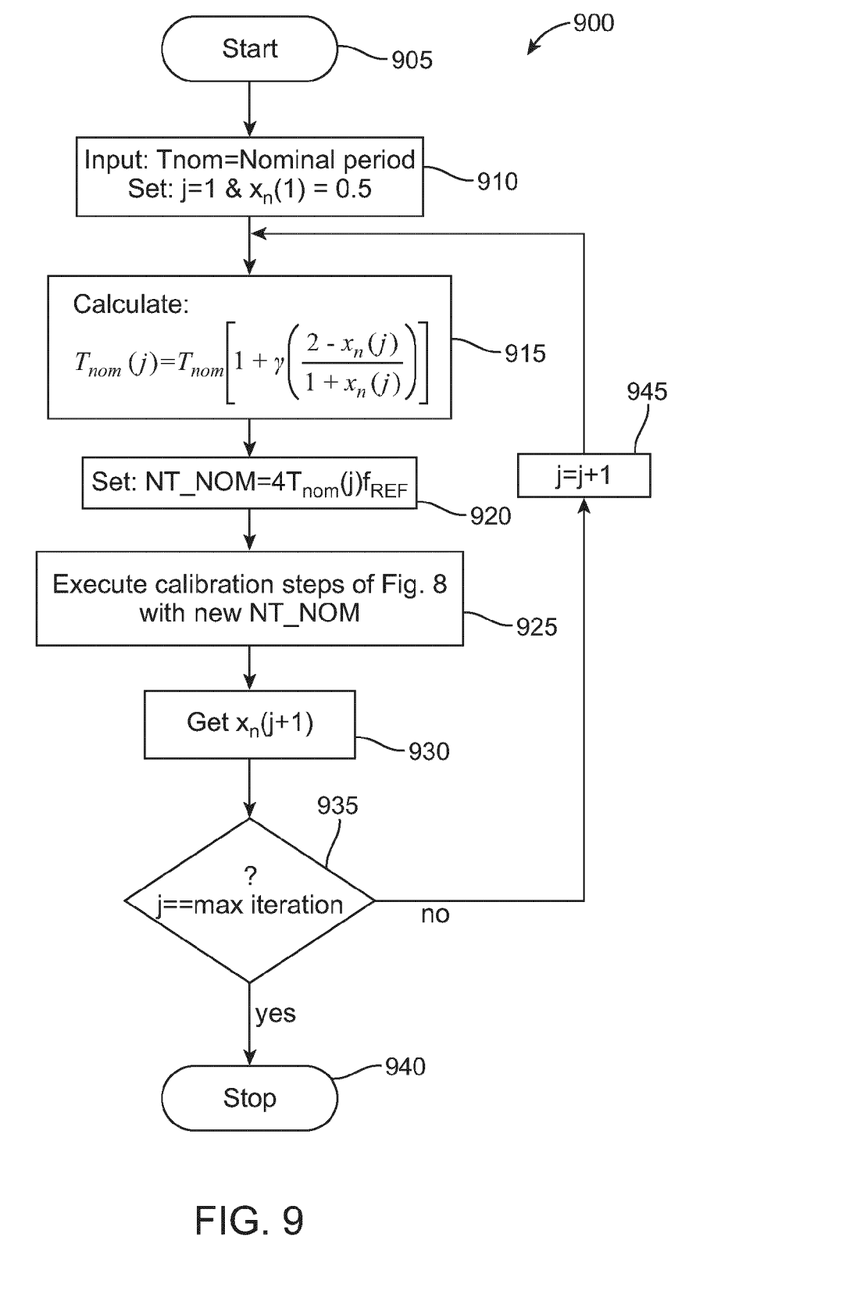
FIG. 9 shows a flow chart for process 900 of calibrating RC according to another embodiment of the invention.

FIG. 9 shows a flow chart for process 900, which is another process that calibrates an RC filter according to another embodiment of the present invention. Process 900 repeatedly iterates execution of process 800 but, prior to each iteration, the value used for NT_NOM is corrected in order to take into account the parasitic capacitance mismatch between capacitance assemblies 116 and 146.

During the process 900 of FIG. 9, the error due to the mismatch of the parasitics of analog monitor circuit and filter capacitor banks are advantageously reduced.

In particular, process 800 is repeated until the mismatch between $C_{cal}$ and $C_{lpf}$ reaches a minimum value. In each iteration of process 800, the nominal period $T_{nom}$ and hence NT_NOM used in that iteration is corrected in order to account the capacitor mismatch error between $C_{cal}$ and $C_{lpf}$. The corrected nominal period can be determined from the error between $C_{cal}$ and $C_{lpf}$. On the $j^{th}$ iteration, the corrected nominal period is given by:

$$T_{nom}(j) = T_{nom}\left[1 + \gamma\left(\frac{2 - x_n(j)}{1 + x_n(j)}\right)\right] \qquad \text{Eq. (10)}$$

Action 910 initializes calibration process 900. The variable j is the iteration count and is initialized to 1. The value of the normalized control word $x_n$ is set to 0.5, based on the fact that action 815 of process 800 will set the value of control word LPF_CAP[N–1:0], 125, to a "one" in bit N–1 and "zero" in the other bits.

Action 915 computes nominal period $T_{nom}(j)$ according to Eq. 10. Then action 920 converts $T_{nom}(j)$ into a NT_NOM count for 4 cycles of time constant signal 149.

Action 925 executes an iteration of process 800. Then action 930 updates $x_n$ based on the value of control word 125 determined by action 925.

Next, action 935 tests to see if the maximum number of iterations has been reached, in which case process 900 ends. Otherwise control is transferred to action 945, in which j is incremented. Then control loops back to action 915.

Numerical analysis has been performed to verify process 900 using Eq. 10. It is observed that satisfactory convergence occurs within 3 iteration cycles over various process and operating conditions.

The processes of FIGS. 8 and 9 are typically performed by the digital calibration circuit 120 of FIG. 1.

This invention includes various embodiments of accurate R-C time constant calibration systems, as described herein. This invention also includes various embodiments of calibration processes for use with these systems. The systems and processes are accurate, fast, and easy-to-implement. In modern CMOS technologies, the integrated resistors and capacitors show a significant variation with process and temperatures and as a result, integrated R-C filters suffer a huge variation in their frequency response characteristics.

Thus various embodiments of this invention may be used to enable integrated R-C filters to have accurate RC time constant calibration in order to meet stringent frequency requirements.

Although this invention has been described in terms of specific embodiments, it is anticipated that alterations and modifications thereof will no doubt become apparent to those skilled in the art. It is therefore intended that the following claims be interpreted as covering all such alterations and modification as falling within the true spirit and scope of the invention.

What is claimed is:

1. A calibration system adapted to calibrate a resistance capacitance (RC) integrated filter including resistors and capacitors having associated therewith parasitic capacitance wherein the calibration system comprises:

a digital calibration circuit that is configured to receive a time constant signal and to generate, based thereon, a control word of 'N' number of digital bits, the RC integrated filter having associated therewith a particular resistor capacitor configuration with a time constant, the RC integrated filter configured to vary in response to the control word; and an analog monitor circuit including a monitor capacitance assembly and having associated therewith a monitor capacitance, the monitor capacitance assembly comprising of one or more resistors and one or more capacitors having a configuration as that of the particular resistor capacitor configuration, wherein the analog monitor circuit includes N switches, wherein each switch is controlled by one of the N digital bits of the control word, and wherein each switch is configured to connect or disconnect one or more capacitors of the analog monitor circuit thereby generating a time constant signal that represents the time constant.

2. The calibration system of claim 1, wherein the RC integrated filter comprises N switches, wherein each switch is controlled by one of the N digital bits of the control word, wherein each switch is configured to connect or disconnect a capacitor corresponding to the switch thereby forming a filter capacitance that varies, depending on the value of the control word, between the capacitance of one of the capacitors and the capacitance of all N+1 of the capacitors thereby varying the time constant of the RC integrated filter.

3. The calibration system of claim 1, wherein the analog monitor circuit includes a relaxation oscillator configured to alternate between a charge phase and a discharge phase, wherein during the charge phase, the monitor capacitance is charged until a charge threshold is reached, wherein during the discharge phase, the monitor capacitance is discharged until a discharge threshold is reached, and further wherein the time constant signal is the output of the relaxation oscillator and the time constant signal has a period associated therewith that is proportional to the resistor-capacitor time-constant of the analog monitor circuit.

4. The calibration system of claim 1, wherein the digital calibration circuit includes a digital counter configured to measure a period of the time constant signal, a register configured to store a nominal value of a period of the time constant signal, and a comparator configured to compare the measured period of the time constant signal and the nominal value.

5. The calibration system of claim 4, wherein the digital calibration circuit is further configured to generate the control word that is used to calibrate the time-constant based on a binary search that attempts to minimize a user-specified error.

6. The calibration system of claim 3, wherein the digital calibration circuit is further configured to generate the control word after taking into account the difference in parasitic capacitance within the monitor capacitance assembly.

7. The calibration system of claim 1, wherein the RC integrated filter is a low pass filter.

8. The calibration system of claim 1, wherein the RC integrated filter is a high pass filter.

9. The calibration system of claim 1, wherein the RC integrated filter is a band pass filter.

10. The calibration system of claim 1, wherein the RC integrated filter is a band reject filter.

* * * * *